(12) United States Patent
Trotta

(10) Patent No.: US 10,284,236 B1
(45) Date of Patent: May 7, 2019

(54) MULTI CHANNEL SELF-TEST FOR RF DEVICES

(71) Applicant: Infineon Technologies AG, Neubiberg (DE)

(72) Inventor: Saverio Trotta, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/970,493

(22) Filed: May 3, 2018

(51) Int. Cl.
*H04B 1/00* (2006.01)
*H04B 1/04* (2006.01)
*H04B 1/30* (2006.01)
*H04B 17/19* (2015.01)

(52) U.S. Cl.
CPC ......... *H04B 1/0082* (2013.01); *H04B 1/0475* (2013.01); *H04B 1/30* (2013.01); *H04B 17/19* (2015.01); *H04B 2001/307* (2013.01)

(58) Field of Classification Search
CPC ........ H04B 17/19; H04B 1/40; H04B 1/0082; H04B 1/0475; H04B 1/30; H03J 2200/08; H03B 27/00; H04L 27/206; H04L 27/38
See application file for complete search history.

(56) References Cited

U.S. PATENT DOCUMENTS

| 8,385,492 | B2 * | 2/2013 | Ho | H04L 25/03006 |
| | | | | 375/340 |
| 2012/0126821 | A1 * | 5/2012 | Forstner | G01R 31/3187 |
| | | | | 324/537 |
| 2014/0355655 | A1 * | 12/2014 | Chakraborty | H04B 1/40 |
| | | | | 375/219 |
| 2015/0177326 | A1 * | 6/2015 | Chakraborty | G01R 31/31716 |
| | | | | 375/224 |
| 2017/0307669 | A1 | 10/2017 | Forstner et al. | |

* cited by examiner

*Primary Examiner* — Khanh C Tran
(74) *Attorney, Agent, or Firm* — Slater Matsil, LLP

(57) ABSTRACT

A radio frequency (RF) device includes a plurality of mixers, each of the plurality of mixers having a first input terminal, a second input terminal, and an output terminal; and a self-test circuit. The self-test circuit includes a buffer having an input terminal and an output terminal, the buffer configured to buffer a reference signal from a local oscillator (LO) to produce a first RF signal at a first frequency; and a plurality of delay elements having different respective transmission delays, the delay elements each having a first end coupled to the output terminal of the buffer and a second end configured to provide a respective delayed signal based on the first RF signal, where the self-test circuit is configured to, in a test mode, couple the second ends of the delay elements to respective first input terminals of the plurality of mixers to provide each mixer with the respective delayed signal, and where the second input terminals of the mixer are configured to receive a second RF signal having the first frequency.

20 Claims, 4 Drawing Sheets

MULTI CHANNEL SELF-TEST FOR RF DEVICES

TECHNICAL FIELD

The present invention relates generally to systems and methods for radio frequency (RF) devices, and, in particular embodiments, to RF devices with built-in self-test (BIST) circuit and methods for operating RF devices with BIST circuit.

BACKGROUND

With the increased demand for radio frequency (RF) systems, there has been a corresponding interest in integrating RF systems on silicon-based integrated circuits instead of using discrete semiconductor components. Examples of RF systems include, for example, automotive radar and high frequency communication systems. By using silicon integration, large volumes of these RF systems can be manufactured at lower costs than discrete component-based systems.

One type of circuit component frequently employed in RF systems is mixer. Mixers generally mix a signal having a first frequency with a signal having a second frequency, resulting in a signal having a third frequency, where the third frequency may be, e.g., a frequency equal to a difference between the first frequency and the second frequency. For example, mixers are used in frequency downconverters. For such downconverters, an incoming RF signal is mixed with a local oscillator (LO) signal resulting in an intermediate frequency (IF) signal which may then be further processed.

During semiconductor manufacturing, RF circuits or devices, such as mixers, are often tested after being fabricated. Conventional methods for testing RF devices, however, may be difficult and comparatively expensive. For example, in devices that operate at over 10 GHz, precision test fixtures and expensive test equipment are often needed. These test fixtures and equipment are comparatively time-consuming to operate, calibrate and maintain. For example, RF probes used for testing have a limited lifetime and wear out over time. Physical deformations, such as bent contacts, can affect high frequency matching networks. In addition, corrosion of contacts and connectors can degrade attenuation characteristics of the conventional test setup. As such, even if large volumes of RF integrated circuits can be manufactured, the testing of the RF integrated circuits may become the bottleneck that reduces throughput.

SUMMARY

In accordance with an embodiment of the present invention, a radio frequency (RF) device includes a plurality of mixers, each of the plurality of mixers having a first input terminal, a second input terminal, and an output terminal; and a self-test circuit. The self-test circuit includes a buffer having an input terminal and an output terminal, the buffer configured to buffer a reference signal from a local oscillator (LO) to produce a first RF signal at a first frequency; and a plurality of delay elements having different respective transmission delays, the delay elements each having a first end coupled to the output terminal of the buffer and a second end configured to provide a respective delayed signal based on the first RF signal, where the self-test circuit is configured to, in a test mode, couple the second ends of the delay elements to respective first input terminals of the plurality of mixers to provide each mixer with the respective delayed signal, and where the second input terminals of the mixer are configured to receive a second RF signal having the first frequency.

In accordance with an embodiment of the present invention, a method of operating a radio frequency (RF) device having a plurality of mixers includes buffering an RF reference signal from an local oscillator (LO) to produce a first RF signal using a buffer, the RF reference signal having a first frequency; delaying the first RF signal by a plurality of delay elements having different respective transmission delays to provide a plurality of respective delayed signals; in a test mode, coupling outputs of the plurality of delay elements to corresponding first inputs of a plurality of mixers; and mixing, using the plurality of mixers, the plurality of respective delayed signals with a second RF signal having the first frequency.

In accordance with an embodiment of the present invention, a method of operating a radio frequency (RF) device includes generating a reference RF signal using a local oscillator (LO) of the RF device; buffering the reference RF signal using a buffer of the RF device, the buffer having a first pre-determined phase shift, thereby introducing the first pre-determined phase shift between the reference RF signal and a first RF signal at an output terminal of the buffer; passing the first RF signal through a plurality of RF paths having different transmission delays to generate a plurality of delayed RF signals, each of the delayed RF signals having a different phase shift from the first RF signal; feeding, in a test mode, the delayed RF signals to respective first input terminals of a plurality of mixers of the RF device; feeding a second RF signal derived from the reference RF signal to respective second input terminals of the plurality of mixers, the second RF signal and the first RF signal having a same frequency; and measuring first outputs at output terminals of the plurality of mixers.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the disclosed embodiments and are not necessarily drawn to scale.

DETAILED DESCRIPTION OF ILLUSTRATIVE EMBODIMENTS

Figure 1:
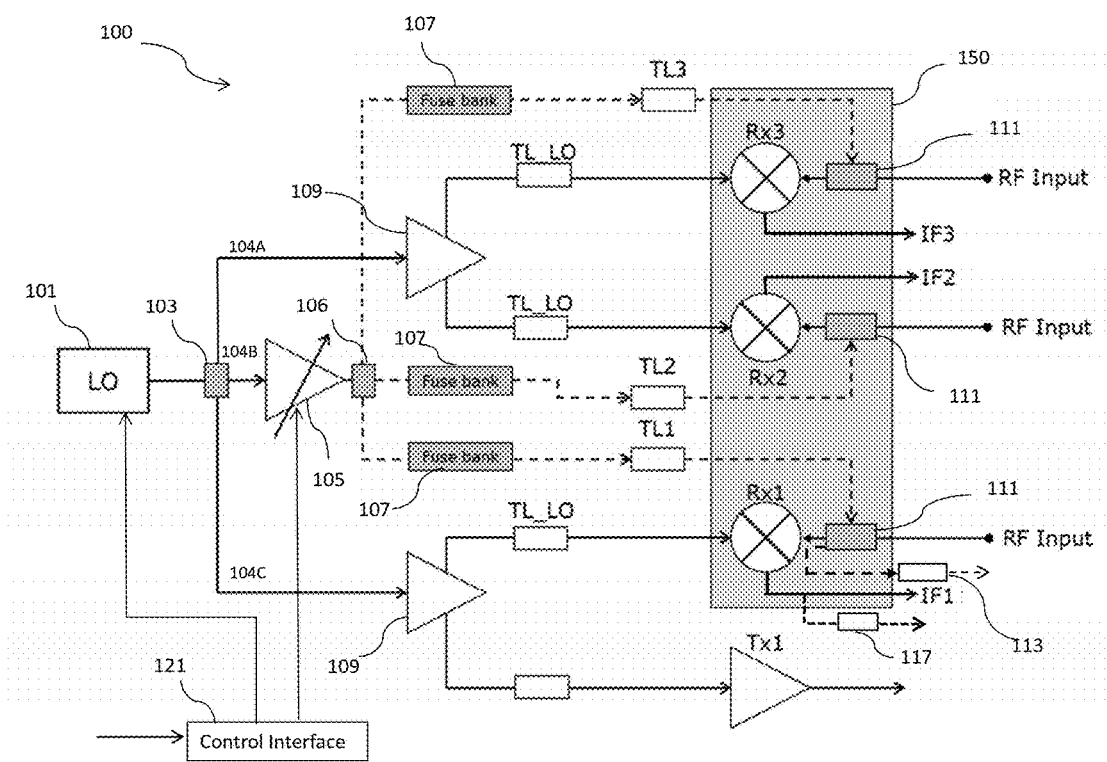
FIG. 1 illustrates a diagram of an RF device with a built-in self-test circuit.

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely RF devices with BIST circuit and method of operating the RF devices with BIST circuit.

In an embodiment, a self-test of an RF circuit having multiple mixers are performed by introducing different phase delayed version of the local oscillator (LO) signal into the RF input port of each mixer. Each of these phase delayed versions may be achieved, for example, driving a plurality of phase delay circuits with a single LO buffer. These phase delay circuits may be implemented, for example, using transmission line delay elements. By monitoring the DC or low frequency value at the output of each mixer, the functionality of the RF circuit can be assessed. Advantages of embodiment self-test circuits include the ability to perform a self-test of multiple RF paths with the addition of a small amount of circuitry, thereby saving power and chip area.

In embodiments of the present invention, an RF device has a plurality of mixers and a BIST circuit. The BIST includes a buffer with an adjustable phase shift and a plurality of delay elements having different respective transmission delays. The buffer is coupled between a local oscillator (LO) and the plurality of delay elements. The LO generates a references signal having a first frequency. The reference signal, after being buffered by the buffer, passes through the delay elements to generate a plurality of delayed signals, where each of the delay signals has the first frequency but a different phase delay. The BIST circuit of the RF device is configured to, in a self-test mode, send each of the delayed signals to a first input terminal (e.g., an RF input terminal) of a respective mixer. A second reference signal, which is derived from the reference signal generated by the LO and having the first frequency, is sent to a second terminal (e.g., an IF input terminal) of each of the mixers. Therefore, in the self-test mode, the output terminal of each of the mixers outputs a direct-current (DC) value that is determined by a phase shift between the second reference signal and a respective delay signal. The phase shift of the buffer may be changed during the self-test mode to produce different DC values at the output terminals of the mixers. The DC values at the output terminals of the mixers may be collected and used by an interpolation process to produce a sine wave. The peak-to-peak value of the sine wave is compared with a pre-determined range, and if the peak-to-peak value is outside the pre-determined range, it is determined that at least one of the mixers is defective, and the RF device may thus be declared defective.

FIG. 1 illustrates a diagram of an RF device 100. Note that for clarity, not all components of the RF device 100 are illustrated in FIG. 1. The RF device 100 includes an RF circuit 150, which includes a plurality of mixers Rx (e.g., Rx1, Rx2, and Rx3). The RF circuit 150 may include additional circuits or components (not shown) such as filters, low-noise amplifier (LNAs), or the like. Circuits and components shown in FIG. 1 and outside the RF circuit 150 may be referred to as a self-test circuit (e.g., a BIST), which self-test circuit is used in a self-test mode (discussed hereinafter) to detect device failure (e.g., broken mixers) of the RF device 100.

As illustrated in FIG. 1, each of the mixers Rx1, Rx2 and Rx3 includes an IF input terminal (e.g., the left-side input terminal of each mixer in FIG. 1), an RF input terminal (e.g., the right-side input terminal of each mixer in FIG. 1), and an output terminal (e.g., IF1, IF2, or IF3 in FIG. 1). The RF circuit 150 further includes a plurality of couplers 111, where an output port of each of the couplers 111 is coupled to the RF input terminal of a respective mixer. The input ports of the couplers 111 are coupled to respective RF input ports (may also be referred to as antenna ports) where RF signals to be received (e.g., an information bearing RF signal, such as an RF signal carrying voice, data, video, or the like) are input at the RF input ports. The couplers 111 may be any type of suitable couplers, such as directional couplers, attenuation pads, or couplers based on capacitive and/or inductive coupling.

As illustrated in FIG. 1, the RF device 100 includes an LO, which generates a reference signal (e.g., a sine wave, a square wave, or the like) having a first frequency. The LO may be a voltage controlled oscillator (VCO), such as an RF VCO circuit known in the art. The LO is controlled through a control interface 121, e.g., to change the frequency of the reference signal, in the illustrated embodiment. In some embodiments, the LO frequency is set using a phase-locked loop (PLL) circuit. In other embodiments, the RF device 100 does not have an LO. Instead, an external LO may be used to provide the reference signal to the RF device 100 via an input terminal (not shown) of the RF device 100. These and other variations are fully intended to be included within the scope of the present disclosure.

Still referring to FIG. 1, the output of the LO (e.g., the reference signal) is split into a plurality of signals by a splitter 103. The power splitter may be implemented using power splitter circuits known in the art, such as Wilkinson power dividers. The splitter 103 may split the input signal into a plurality of signals that are substantially the same. The outputs of the splitter 103 have substantially the same frequency, and additionally may have substantially the same phase, in some embodiments. In the example of FIG. 1, the splitter 103 is a three-way splitter, although other numbers of splitters and/or other types of splitters (e.g., two-way splitter, four-way splitter) may also be used. In FIG. 1, the upper branch 104A and the lower branch 104C of the output of the splitter 103 are each sent to a buffer 109, and the middle branch 104B of the output of the splitter 103 is sent to a buffer 105.

The buffers (e.g., 109, 105) may be implemented using any suitable hardware, such as transistors, and may be used to buffer the input signal (e.g., from the splitter 103) and isolate the output of the buffer from the input of the buffer. For example, the buffer (e.g., 109, 105) may be used to provide, at an output terminal of the buffer, a signal with a driving capability different (e.g., stronger driving capability) from that of the input signal of the buffer.

Outputs of the buffers 109 (e.g., in the upper branch 104A and in the lower branch 104C) are each connected to a first end of a respective delay element TL_LO, and the second end of the delay element TL_LO is sent to the IF input terminal of a respective mixer Rx. The delay elements TL_LO may be passive delay elements, e.g., transmission delay lines. In some embodiments, the delay elements are active delay elements, e.g., phase shifters or time delays. The transmission delays of the active delay elements may be dynamically adjusted. In some embodiments, the delay elements TL_LO are substantially the same, and therefore, the input signals at the IF input terminals of the mixers Rx are substantially the same. In the illustrated embodiment, since the buffers 109/105 and/or the delay elements TL_LO introduce pre-determined phase shifts, the input signals at the IF input terminals of the mixers Rx have the same frequency as the reference signal generated by the LO. A phase shift may be referred to as a phase delay in the discussion herein.

Still referring to FIG. 1, the buffer 105 is a buffer having an adjustable phase shift. The phase shift of the buffer 105 may be adjusted, e.g., via the control interface 121. The buffer 105 introduces a pre-determined phase delay between the output signal of the buffer 105 and the input signal of the buffer 105. In an exemplary embodiment, the buffer 105 has two pre-determined phase shifts that are selectable via, e.g., the control interface 121. The two pre-determined phase shifts may be, e.g., 0 degree and 90 degrees (0/90 degrees), or 0 degree and 180 degrees (0/180 degrees), although other values for the phase shifts are also possible.

As illustrated in FIG. 1, the output of the buffer 105 is sent to a splitter 106, and the outputs of the splitter 106 are sent to first ends of delay elements TL1, TL2 and TL3. The splitter 106 may be the same as or similar to the splitter 103, and the delay elements TL1, TL2, and TL3 may be, e.g., active delay elements or passive delay elements, the same as or similar to the delay element TL_LO (but with different transmission delays), thus details may not be repeated. In the illustrated embodiment, each of the delay elements TL1, TL2 and TL3 has a different transmission delay, and therefore, introduces a different phase delay to the RF signal passing through the delay element (TL1, TL2, or TL3). For example, the delay element T1, T2, and T3 may be transmission delay lines, the transmission delay line of T2 is about 400 µm longer than that of T1, and the transmission delay line of T3 is about 400 µm longer than that of T2. The difference of 400 µm in the transmission delay line length corresponds to a phase difference (e.g., phase delay) of about 28.8 degrees for a RF frequency of 60 GHz, as an example.

The signals at the second ends of the delay elements TL1, TL2, and TL3 are therefore delayed (e.g., phase-delayed) versions of the reference signal generated by the LO. For this reason, the signals at the second ends of the delay elements TL1, TL2, and TL3 are also referred to as delayed signals, or delayed reference signals. Note that the delayed signals at the second ends of the delay elements TL1, TL2, and TL3 have the same frequency as the reference signal generated by the LO, but each delayed signal has a different phase due to the different phase shifts caused by, e.g., the delay elements TL1, TL2 and TL3, in some embodiments.

Each of the delayed signals at the second ends of the delay elements TL1, TL2, and TL3 is sent to an input port of a respective coupler 111. As described in more details hereinafter, during normal operation mode (e.g., when the RF device 100 is demodulating information bearing RF signals received at the antenna ports), the couplers 111 couple the RF signals at the antenna ports to respective RF input terminals of the mixers. During self-test mode (e.g., when the RF device 100 performs a self-test of the mixers and/or other internal circuits instead of demodulating RF signals from the antenna ports), the couplers 111 couple the delayed signals at the second ends of the delay elements TL1, TL2, and TL3 to respective RF input terminals of the mixers. The dashed lines in FIG. 1 illustrate electrical connections related to the self-test mode.

FIG. 1 further illustrates a fuse bank 107 connected to each of the delay elements TL1, TL2 and TL3. The fuse bank 107 is optional and may be omitted in some embodiments. The fuse banks 107 serve as adjustable phase shifters and are used to adjust, or fine-tune, the phases of the delayed signals at the second ends of the delay elements TL1, TL2, and TL3, in some embodiments. Details of the fuse bank 107 are illustrated in FIG. 2.

Figure 2:
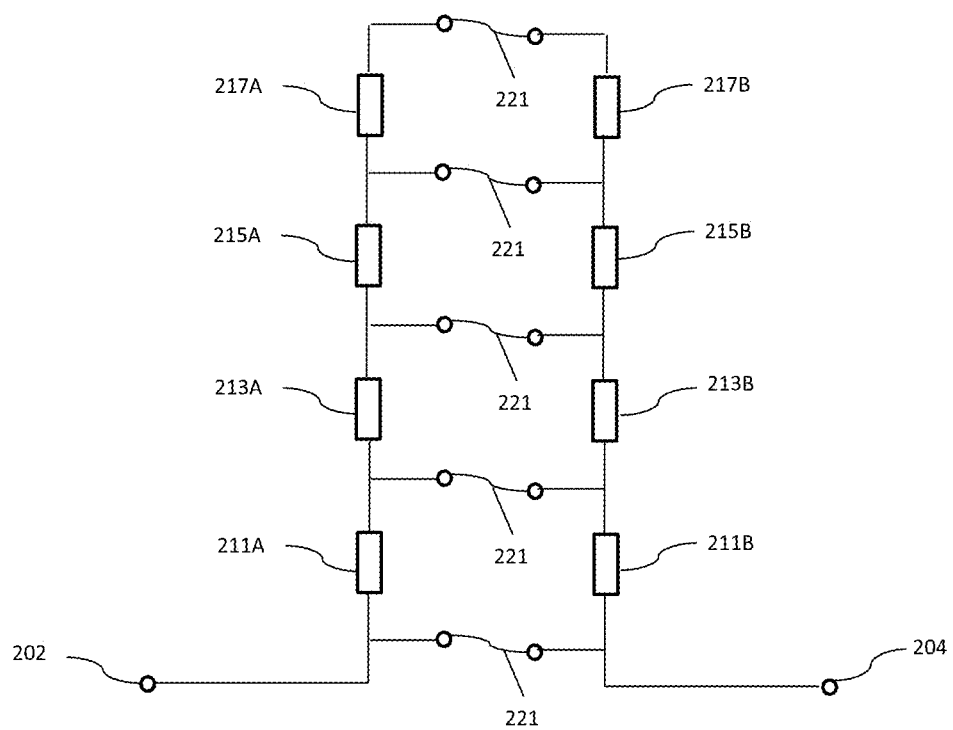
FIG. 2 is a diagram of a fuse bank.

Referring to FIG. 2, the fuse bank 107 comprises a first terminal 202 and a second terminal 204. The fuse bank 107 further comprises a plurality of delay elements (e.g., 211A, 213A, 215A, 217A, 217B, 215B, 213B and 211B) and a plurality of switches 221 interposed between and connecting respective ends of the delay elements. The delay elements of the fuse bank 107 may have different transmission delays to introduce different phase delays. The transmission delays may be determined by, e.g., the operating frequencies of the RF device 100, and the target phase delays to be provided by the fuse bank 107. In some embodiments, the switches 211 are initially closed when the fuse bank 107 is fabricated. During product testing and/or calibration of the RF device 100, one or more of the switches 211 are opened, e.g., by a trimmer process such as a laser trimmer process. The trimmer process therefore sets the transmission delay (thus phase shift) of the fuse bank 107 between the first terminal 202 and the second terminal 204. In some embodiments, for a plurality of RF devices 100 manufactured in a same production batch, a few sample RF devices 100 are tested and calibrated to determine a setting of the fuse banks 107 for a specific application, then the same setting is applied (e.g., via a laser trimmer process) for all the RF devices 100 in the same production batch.

Referring back to FIG. 1, during normal operation mode, the output of the buffer 105 is disabled, e.g., by the control interface 121, and the couplers 111 couple the RF signals received at the antenna ports to the RF input terminals of respective mixers Rx. In other embodiments, a switch (not shown) may be coupled between the buffer 105 and the splitter 106, and the switch may be opened to disconnect the output of the buffer 105 from the splitter 106 during normal operation mode. Each of the mixers Rx (e.g., Rx1, RX2, or Rx3) down-converts a corresponding RF signal by mixing the RF signal (e.g., having an RF frequency $f_{RF}$) with the signal at the IF input terminal (e.g., a delayed version of the reference signal having frequency $f_{LO}$), and outputs an IF signal having a frequency $f_{IF}$ at the output terminal (e.g., IF1, IF2, or IF3) of the mixer. The frequency $f_{IF}$ is equal to $f_{RF}-f_{LO}$, in some embodiments. The IF signals may then be further processed by additional circuits (not shown) of the RF device 100, such as circuits for filtering (e.g., low-pass filtering, band-pass filtering, high-pass filter), analog-to-digital conversion, or the like. In some embodiments, the IF signals are sent as outputs of the RF device 100, such that the IF signals may be processed by another device or system.

During self-test mode, the output of the buffer 105 is activated (e.g., enabled), e.g., by the control interface 121, and the couplers 111 couple the delayed signals at the second ends of the delay elements TL1, TL2, and TL3 to the respective RF input terminals of the mixers. In some embodiments, the antenna ports are left open (e.g., not connected to an antenna) in the self-test mode (e.g., in front end testing) so that no external RF signal is fed into the antenna ports. In other embodiments, the antenna ports are connected with input signals (e.g., in back end testing). Since the delayed signals (e.g., from TL1, TL2, and TL3) at the RF input terminals of the mixers have the same frequency (e.g., $f_{LO}$) as the signals (e.g., from the delay elements TL_LO) at the IF input terminals of the mixers, the signals at the output terminals (e.g., IF1, IF2, IF3) of the mixers are DC signals. The values of the DC signals may be referred to as DC offsets. In some embodiments, the DC offset of each of the DC signals during the self-test mode is determined by the difference between the phase $\theta_{RF}$ of the signal at the RF input terminal of the mixer and the phase $\theta_{IF}$ of the signal at the IF input terminal of the mixer. For example, the DC offset of a corresponding DC signal may be proportional to $\sin(\theta_{RF}-\theta_{IF})$. For ease of discussion, the difference between the phase $\theta_{RF}$ of the signal at the RF input terminal of the mixer and the phase $\theta_{IF}$ of the signal at the IF input terminal of the mixer may be referred to as the phase difference between the RF input and the IF input of the mixer.

Since the delay elements TL1, TL2, and TL3, together with the fuse banks 107 if formed, introduce different phase delays to the signals coupled to the RF input terminals of the mixers, the DC offsets of the DC signals at the output terminals (e.g., IF1, IF2, and IF3) of the mixers are different. In the example of FIG. 1, three mixers are used, and therefore, three different DC offsets are obtained. In some embodiments, the self-test process includes collecting (e.g., recording) the DC offsets. These DC offsets are collected while the buffer 105 has a first pre-determined phase shift, and therefore, are referred to as the first DC offsets to distinguish from other DC offsets (referred to as second DC offsets) collected in a subsequent step of the self-test mode when the buffer 105 has a second pre-determined phase shift.

Once the first DC offsets are recorded, the phase shift of the buffer 105 is changed, e.g., via the control interface 121, from the first pre-determined phase shift to the second pre-determined phase shift different from the first pre-determined phase shift. For example, the phase shift of the buffer 105 may be changed from 0 degree to 90 degrees, which in turn causes the phase difference between the RF input and the IF input of the mixer to increase by, e.g., 90 degrees. As a result, for the example discussed above, the DC offset of the DC signal at the output terminal of each mixer may now be proportional to, e.g., $\sin(\theta_{RF}-\theta_{IF}+\pi/2)$ due to the 90-degree phase shift. These new DC offsets are collected as the second DC offsets. The first DC offsets and the second DC offsets are used to detect failure of the mixers, as discussed in details hereinafter.

In some embodiments, the first DC offsets and the second DC offsets are collected as analog signals. In other embodiments, the first DC offsets and the second DC offsets are collected as digital signals, in which case analog-to-digital converts (ADCs) may be formed in the RF device 100 to convert the DC offsets (e.g., first DC offsets and the second DC offsets) into digital values. For simplicity, FIG. 1 only illustrates an ADC 117 coupled to the output terminal IF1 of the mixers Rx1. It is understood that each of the output terminals (e.g., IF1, IF2, IF3) may be connected to a respective ADC 117 to convert the DC offset into a digital value. FIG. 1 further illustrates an optional RF power detector 113 coupled to the coupler 111. Although one RF power detector 113 is illustrated in FIG. 1, it is understood that each coupler 111 may have a respective RF power detector 113 coupled thereto. The RF power detector 113, if formed, may be used to estimate the conversion gain of the mixers, as discussed hereinafter.

Figure 3:
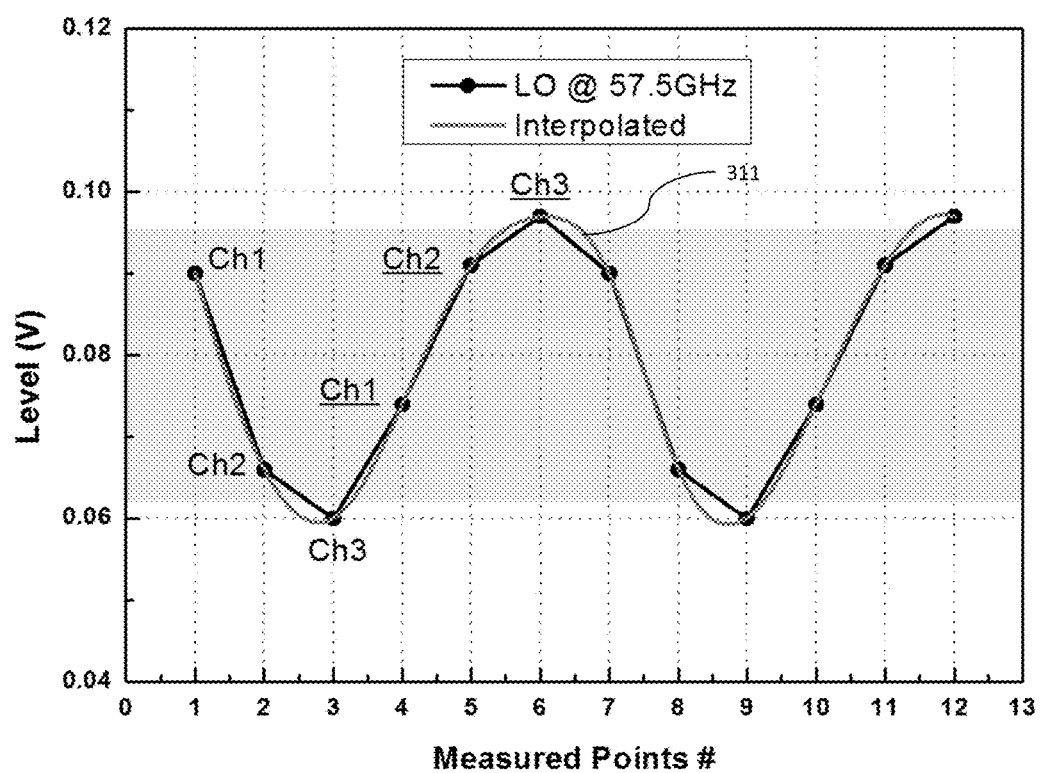
FIG. 3 illustrates a sine wave interpolated using data collected in test mode.

Referring now to FIG. 3, a curve 311 is illustrated in FIG. 3. In the illustrated embodiment, the curve 311 is a sine wave. The curve 311 is formed by performing an interpolation using the first DC offsets and the second DC offsets collected as discussed above, in some embodiments. While the curve 311 is referred to as a sine wave in the discussion herein, the curve 311 may also be interpolated as a cosine wave, and the principle of the present invention may be applied to such cases (e.g., cosine wave). In the example of FIG. 3, the first DC offsets are shown by points Ch1, Ch2, and Ch3 on the curve 311, and the second DC offsets are shown by points Ch1, Ch2, and Ch3 on the curve 311. The interpolation may use any suitable interpolation algorithm, such as polynomial interpolation, spline interpolation, or the like. In some embodiments, the interpolation algorithm takes into consideration that the first DC offsets and the second DC offsets should fall on a sine wave to achieve better interpolation results. For example, the interpolation algorithm may model the curve 311 as a sine wave with unknown parameters (e.g., amplitude, phase, and/or frequency), and the unknown parameters may be estimated or calculated using the first DC offsets and the second DC offsets. The discussion hereinafter may refer to the curve 311 as a sine wave.

The curve 311 may be interpolated using more data points than the first DC offsets and the second DC offsets collected as described above. In particular, the phase shift of the buffer 105 may change alternately between the first pre-determined phase shift and the second pre-determined phase shift, with the DC offsets at the output terminals of the mixers being collected each time the phase shift of the buffer 105 changes. By collecting and using more data points for the interpolation, the curve 311 may be generated more accurately, since adverse effects of random noise in the collected DC offsets may be reduced using signal processing techniques, such as averaging or filtering.

Once the curve 311 (e.g., a sine wave) is formed by the interpolation process, the peak-to-peak value of the sine wave is determined and compared with a pre-determined range. Here the peak-to-peak value refers to the value between a maximum value of the sine wave and a minimum value of the sine wave. The pre-determined range for the peak-to-peak value may be determined by, at least in part, the expected conversion gains of the mixers. Since the amplitudes of the DC offsets are proportional to the conversion gains of the mixers, failure in one or more of the mixers may cause the peak-to-peak value of the sine wave fall outside the pre-determined range. If one or more of the mixers are defective, the RF device 100 is declared to be defective, in some embodiments. In other words, if the peak-to-peak value of the interpolated sine wave is outside the pre-determined range, the RF device 100 is declared to be defective and may be discarded, in some embodiments.

Since the phase shifts of the delay elements (e.g., TL_LO, TL1, TL2, TL3) and the fuse banks 107 are known, the expected values of the first DC offsets and the expected value of the second DC offsets are pre-determined (e.g., known), in some embodiments. Therefore, there is an expected relationship among the first DC offsets and the second DC offsets. For example, in FIG. 3, the expected relationship among the various DC offsets may include Ch1>Ch2>Ch3, and Ch1<Ch2<Ch3. In addition, the expected relationship may include Ch3<Ch1, Ch1<Ch3, or the like. In some embodiments, the relationship among the measured DC offsets (e.g., first DC offsets and the second DC offsets) are compared with the expected relationship of the DC offsets, and if there is a mismatch (e.g., discrepancy), the RF device 100 is declared defective.

In embodiments where RF power detectors 113 are formed in the RF device 100, a ratio between the peak-to-peak value of the sine wave and the measured RF power from the RF power detector 113 may be determined (e.g., calculated), which ratio may be proportional to the mixer conversion gain. The ratio is then compared with a per-determined range for the mixer conversion gain, and the mixer is declared defective if the ratio is outside the per-determined range for the mixer conversion gain, in some embodiments.

The values of the first DC offsets and the second DC offsets may be chosen to facilitate the interpolation process to generate the sine wave. For example, a good choice may be that the first DC offsets and the second DC offsets are distributed approximately evenly between the maximum value of the sine wave and the minimum value of the sine wave, similar to the example of FIG. 3. Recall that each of the DC offsets is determined by the phase difference between the RF input and the IF input of the respective mixer, the DC offsets may therefore be adjusted by choosing the transmission delays of the delay elements TL1, TL2, and TL3 to achieve the targeted phase shifts. In addition, in embodiments where the fuse banks 107 are used, the DC offsets may be fine-tuned by adjusting the transmission delays of the fuse banks 107 through the trimming process.

In some embodiments, the methods for performing the self-test and for generating the interpolated curve 311 discussed above are applicable for cases where the RF circuit 150 is not loaded with the package impedance (e.g., a front end test). In embodiments where the RF circuit 150 is loaded with the package impedance, e.g., in a back end test, the DC offsets may be small (e.g., approximately zero), and the DC offsets may remain about the same across all the mixers Rx regardless of the phase difference between the RF input and the IF input of each of the mixers. Therefore, the self-test method and the interpolated curve 311 discussed above may not be applicable to the cases when the RF circuit 150 is loaded with the package impedance. However, the relative stable DC offsets across all the mixers may be used as a crude test to confirm that the RF circuit 150 is connected properly when loaded (e.g., in a back end test).

Variations and modifications to the disclosed embodiments are possible and are fully intended to be included within the scope of the present disclosure. For example, FIG. 1 illustrates three mixers as examples. The number of mixers may be more or less than three, and the principle disclosed herein applies to any number of mixers. As another example, the buffer 105 may have more than two pre-determined phase shifts, in which case more DC offsets may be collected and used in the interpolation process to generate the sine wave. As yet another example, when the number of mixers is large (e.g., six or more), the phase delays of the delay elements connected to the RF input terminals of the mixers may be chosen such that the DC offsets at the output terminals of the mixers achieve a good coverage of the peak-to-peak value of the sine wave, and therefore, the sine wave may be interpolated using the measured first DC offsets only. In other words, the measured DC offsets corresponding to a single pre-determined phase shift of the buffer 105 may be used by the interpolation process to generate the sine wave, in which case the buffer 105 may be simplified since there is no need to provide two or more different phase shifts.

Methods and circuits for using the DC offsets to evaluate an RF device are disclosed in U.S. Patent Application No. 2017/0307669 A1, which application is incorporated by reference herein in its entirety. The various ways of using the DC offsets for evaluation of the RF device may also be used in the present invention, after the DC offsets are collected using the methods and circuits disclosed in the present invention.

Embodiments may achieve advantages. By forming the built-in self-test circuit in a same semiconductor chip with the RF circuit 150, the need for external testing equipment for evaluating the RF device 100 is obviated. The evaluation/test of the RF device 100 can be performed easily and quickly using the self-test methods disclosed above, thereby reducing the time needed for evaluation/test of the RF device and improving the production throughput. The self-test circuit of the present disclosure share the buffer 105 with all the mixers, thereby saving power and/or chip area by obviating the need to have a separate buffer 105 for each of the mixers. In some embodiments, an adjustable phase is not required, thereby saving power and chip area. In embodiments that utilize an adjustable phase shifter, a buffer with a selectable polarity may be used to provide two phase settings. Such a buffer also provides a savings of power and/or chip area with respect to phase shifters that provide greater than two selectable phase settings.

Figure 4:
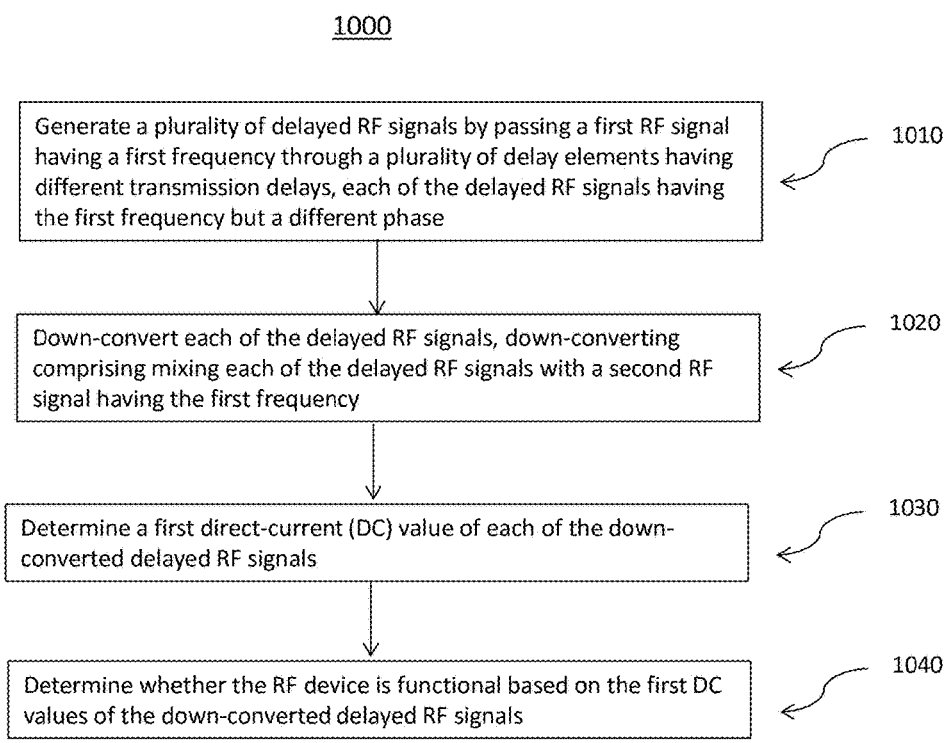
FIG. 4 illustrates a flow chart for a method of performing a self-test on an RF device having a plurality of mixers.

FIG. 4 illustrates a flow chart of a method for performing a self-test on a radio frequency (RF) device having a plurality of mixers, in some embodiments. It should be understood that the embodiment method shown in FIG. 4 is merely an example of many possible embodiment methods. One of ordinary skill in the art would recognize many variations, alternatives, and modifications. For example, various steps as illustrated in FIG. 4 may be added, removed, replaced, rearranged and repeated.

Referring to FIG. 4, at block 1010, a plurality of delayed RF signals are generated by passing a first RF signal having a first frequency through a plurality of delay elements having different transmission delays, each of the delayed RF signals having the first frequency but a different phase. At block 1020, each of the delayed RF signals is down-converted, where down-converting includes mixing each of the delayed RF signals with a second RF signal having the first frequency. At block 1030, a first direct-current (DC) value of each of the down-converted delayed RF signals is determined. At block 1040, whether the RF device is functional is determined based on the first DC values of the down-converted delayed RF signals.

Example embodiments of the present invention are summarized here. Other embodiments can also be understood from the entirety of the specification and the claims filed herein.

Example 1

In an embodiment, a radio frequency (RF) device includes a plurality of mixers, each of the plurality of mixers having a first input terminal, a second input terminal, and an output terminal; and a self-test circuit. The self-test circuit includes a buffer having an input terminal and an output terminal, the buffer configured to buffer a reference signal from a local oscillator (LO) to produce a first RF signal at a first frequency; and a plurality of delay elements having different respective transmission delays, the delay elements each having a first end coupled to the output terminal of the buffer and a second end configured to provide a respective delayed signal based on the first RF signal, where the self-test circuit is configured to, in a test mode, couple the second ends of the delay elements to respective first input terminals of the plurality of mixers to provide each mixer with the respective delayed signal, and where the second input terminals of the mixer are configured to receive a second RF signal having the first frequency.

Example 2

The RF device of example 1, wherein the RF device further comprises the LO, wherein an output terminal of the LO is further coupled to the second input terminals of the plurality of mixers to provide the second RF signal.

Example 3

The RF device of example 1 or 2, wherein the self-test circuit is configured to, in the test mode, change a phase shift of the buffer from a first value to a second value.

Example 4

The RF device of example 1 or 2, wherein the self-test circuit further comprises a plurality of couplers coupled between the plurality of delay elements and respective ones of the plurality of mixers.

Example 5

The RF device of example 4, wherein the plurality of couplers is further coupled to respective antenna ports of the RF device.

Example 6

The RF device of example 1 or 2, wherein the self-test circuit is configured to, in a normal operation mode, couple a plurality of antenna ports to respective first input terminals of the plurality of mixers.

Example 7

The RF device of example 1, wherein a phase shift of the buffer is reconfigurable through a control interface of the self-test circuit.

Example 8

The RF device of example 1, wherein the self-test circuit further comprises a plurality of analog-to-digital converters (ADCs), wherein the plurality of ADCs are coupled to respective output terminals of the plurality of mixers.

Example 9

A method of operating a radio frequency (RF) device having a plurality of mixers includes buffering an RF reference signal from an local oscillator (LO) to produce a first RF signal using a buffer, the RF reference signal having a first frequency; delaying the first RF signal by a plurality of delay elements having different respective transmission delays to provide a plurality of respective delayed signals; in a test mode, coupling outputs of the plurality of delay elements to corresponding first inputs of a plurality of mixers; and mixing, using the plurality of mixers, the plurality of respective delayed signals with a second RF signal having the first frequency.

Example 10

The method of example 9, wherein the buffer introduces a first pre-determined phase shift, and wherein the plurality of respective delayed RF signals have different phases.

Example 11

The method of example 9 or 10, wherein the second RF signal comprises the RF reference signal; and the method further comprises determining first direct-current (DC) values at output terminals of the plurality of mixers.

Example 12

The method of example 11, further comprising determining whether the RF device is functional based on the first DC values.

Example 13

The method of example 11, further comprising after determining the first DC values, configuring the buffer to have a second pre-determined phase shift different from the first pre-determined phase shift; and determining second DC values at the output terminals of the plurality of mixers.

Example 14

The method of example 13, further comprising performing an interpolation to generate a sine wave using the first DC values and the second DC values; and comparing a peak-to-peak value of the sine wave to a pre-determined range.

Example 15

The method of example 14, further comprising determining whether the peak-to-peak value is outside the pre-determined range; and in response to detecting that the peak-to-peak value is outside the pre-determined range, declaring that the RF device is defective.

Example 16

The method of example 13, further comprising determining a relationship among the first DC values and the second DC values; comparing the relationship with a pre-defined relationship; and declaring that the RF device is defective in response to detecting that the relationship does not match the pre-defined relationship.

Example 17

A method of operating a radio frequency (RF) device includes generating a reference RF signal using a local oscillator (LO) of the RF device; buffering the reference RF signal using a buffer of the RF device, the buffer having a first pre-determined phase shift, thereby introducing the first pre-determined phase shift between the reference RF signal and a first RF signal at an output terminal of the buffer; passing the first RF signal through a plurality of RF paths having different transmission delays to generate a plurality of delayed RF signals, each of the delayed RF signals having a different phase shift from the first RF signal; feeding, in a test mode, the delayed RF signals to respective first input terminals of a plurality of mixers of the RF device; feeding a second RF signal derived from the reference RF signal to respective second input terminals of the plurality of mixers, the second RF signal and the first RF signal having a same frequency; and measuring first outputs at output terminals of the plurality of mixers.

Example 18

The method of example 17, wherein the buffer has a re-configurable phase shift, wherein the method further comprises reconfiguring, in the test mode, the buffer to have a second per-determined phase shift; and measuring, in the test mode, second outputs at the output terminals of the plurality of mixers after reconfiguring the buffer.

Example 19

The method of example 18, further comprising generating a sine wave by interpolation using measured values of the first outputs and measured values of the second outputs; and checking whether a peak-to-peak value of the sine wave is within a pre-determined range.

Example 20

The method of example 17, further comprising feeding, in a normal operation mode, a plurality of third RF signals to be received by the RF device to the first input terminals of the plurality of mixers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A radio frequency (RF) device comprising:
   a plurality of mixers, each of the plurality of mixers having a first input terminal, a second input terminal, and an output terminal; and
   a self-test circuit comprising:
      a buffer having an input terminal and an output terminal, the buffer configured to buffer a reference signal from a local oscillator (LO) to produce a first RF signal at a first frequency; and
      a plurality of delay elements having different respective transmission delays, the delay elements each having a first end coupled to the output terminal of the buffer and a second end configured to provide a respective delayed signal based on the first RF signal, wherein the self-test circuit is configured to, in a test mode, couple the second ends of the delay elements to respective first input terminals of the plurality of mixers to provide each mixer with the respective delayed signal, and wherein the second input terminals of the mixer are configured to receive a second RF signal having the first frequency.

2. The RF device of claim 1, wherein the RF device further comprises the LO, wherein an output terminal of the LO is further coupled to the second input terminals of the plurality of mixers to provide the second RF signal.

3. The RF device of claim 2, wherein the self-test circuit is configured to, in the test mode, change a phase shift of the buffer from a first value to a second value.

4. The RF device of claim 2, wherein the self-test circuit further comprises a plurality of couplers coupled between the plurality of delay elements and respective ones of the plurality of mixers.

5. The RF device of claim 4, wherein the plurality of couplers is further coupled to respective antenna ports of the RF device.

6. The RF device of claim 2, wherein the self-test circuit is configured to, in a normal operation mode, couple a plurality of antenna ports to respective first input terminals of the plurality of mixers.

7. The RF device of claim 1, wherein a phase shift of the buffer is reconfigurable through a control interface of the self-test circuit.

8. The RF device of claim 1, wherein the self-test circuit further comprises a plurality of analog-to-digital converters (ADCs), wherein the plurality of ADCs are coupled to respective output terminals of the plurality of mixers.

9. A method of operating a radio frequency (RF) device having a plurality of mixers, the method comprising:
   buffering an RF reference signal from an local oscillator (LO) to produce a first RF signal using a buffer, the RF reference signal having a first frequency;
   delaying the first RF signal by a plurality of delay elements having different respective transmission delays to provide a plurality of respective delayed signals;
   in a test mode, coupling outputs of the plurality of delay elements to corresponding first inputs of a plurality of mixers; and
   mixing, using the plurality of mixers, the plurality of respective delayed signals with a second RF signal having the first frequency.

10. The method of claim 9, wherein the buffer introduces a first pre-determined phase shift, and wherein the plurality of respective delayed RF signals have different phases.

11. The method of claim 10, wherein:
   the second RF signal comprises the RF reference signal; and
   the method further comprises determining first direct-current (DC) values at output terminals of the plurality of mixers.

12. The method of claim 11, further comprising determining whether the RF device is functional based on the first DC values.

13. The method of claim 11, further comprising:
   after determining the first DC values, configuring the buffer to have a second pre-determined phase shift different from the first pre-determined phase shift; and
   determining second DC values at the output terminals of the plurality of mixers.

14. The method of claim 13, further comprising:
   performing an interpolation to generate a sine wave using the first DC values and the second DC values; and
   comparing a peak-to-peak value of the sine wave to a pre-determined range.

15. The method of claim 14, further comprising:
   determining whether the peak-to-peak value is outside the pre-determined range; and
   in response to detecting that the peak-to-peak value is outside the pre-determined range, declaring that the RF device is defective.

16. The method of claim 13, further comprising:
   determining a relationship among the first DC values and the second DC values;
   comparing the relationship with a pre-defined relationship; and
   declaring that the RF device is defective in response to detecting that the relationship does not match the pre-defined relationship.

17. A method of operating a radio frequency (RF) device, the method comprising:
   generating a reference RF signal using a local oscillator (LO) of the RF device;
   buffering the reference RF signal using a buffer of the RF device, the buffer having a first pre-determined phase shift, thereby introducing the first pre-determined phase shift between the reference RF signal and a first RF signal at an output terminal of the buffer;
   passing the first RF signal through a plurality of RF paths having different transmission delays to generate a plurality of delayed RF signals, each of the delayed RF signals having a different phase shift from the first RF signal;
   feeding, in a test mode, the delayed RF signals to respective first input terminals of a plurality of mixers of the RF device;

feeding a second RF signal derived from the reference RF signal to respective second input terminals of the plurality of mixers, the second RF signal and the first RF signal having a same frequency; and measuring first outputs at output terminals of the plurality of mixers.

18. The method of claim 17, wherein the buffer has a re-configurable phase shift, wherein the method further comprises:

reconfiguring, in the test mode, the buffer to have a second per-determined phase shift; and measuring, in the test mode, second outputs at the output terminals of the plurality of mixers after reconfiguring the buffer.

19. The method of claim 18, further comprising:

generating a sine wave by interpolation using measured values of the first outputs and measured values of the second outputs; and checking whether a peak-to-peak value of the sine wave is within a pre-determined range.

20. The method of claim 17, further comprising:

feeding, in a normal operation mode, a plurality of third RF signals to be received by the RF device to the first input terminals of the plurality of mixers.

* * * * *